(12) United States Patent
Zhang

(10) Patent No.: US 12,256,506 B1
(45) Date of Patent: Mar. 18, 2025

(54) WIRELESS SWITCHING CONTROLLER FOR MEDIA DEVICES

(71) Applicant: Yuanhui Zhang, Shenzhen (CN)

(72) Inventor: Yuanhui Zhang, Shenzhen (CN)

( * ) Notice: Subject to any disclaimer, the term of this patent is extended or adjusted under 35 U.S.C. 154(b) by 0 days.

(21) Appl. No.: 18/796,745

(22) Filed: Aug. 7, 2024

(51) Int. Cl.
| | | |
|---|---|---|
| H05K 5/02 | (2006.01) | |
| H05K 1/18 | (2006.01) | |
| H05K 7/14 | (2006.01) | |
| H04M 1/04 | (2006.01) | |

(52) U.S. Cl.
CPC ........... *H05K 5/0217* (2013.01); *H05K 1/181* (2013.01); *H05K 7/1427* (2013.01); *H04M 1/04* (2013.01); *H05K 2201/10053* (2013.01)

(58) Field of Classification Search
USPC ........ 361/752, 728, 730, 796, 800, 801, 803
See application file for complete search history.

(56) References Cited

U.S. PATENT DOCUMENTS

| | | | | |
|---|---|---|---|---|
| 11,729,923 B1 * | 8/2023 | Huang | ................. | H05K 5/0069 |
| | | | | 361/752 |
| 2015/0236445 A1 * | 8/2015 | Wang | ................. | H01R 13/6205 |
| | | | | 439/38 |
| 2016/0094076 A1 * | 3/2016 | Kasar | ................... | H02J 7/0042 |
| | | | | 320/103 |
| 2018/0048192 A1 * | 2/2018 | Alonso | ................... | H02J 50/80 |
| 2021/0384754 A1 * | 12/2021 | Xu | ........................ | H01F 38/14 |

FOREIGN PATENT DOCUMENTS

| | | | | |
|---|---|---|---|---|
| CN | 210744012 U | * | 6/2020 | ............. H01M 2/10 |
| KR | 20140001056 U | * | 2/2014 | ............... H02J 7/00 |

* cited by examiner

*Primary Examiner* — Hung S. Bui
(74) *Attorney, Agent, or Firm* — Daniel M. Cohn; Howard M. Cohn

(57) ABSTRACT

A wireless switching controller for media devices is provided, including a main body and a remote controller. The remote controller includes a first housing having a cavity, the main body includes a main device body and a clamping component, and the clamping component is rotatably connected to the main device body through a rotating shaft. The remote controller is communicated with the main device body through a wireless communication manner. The main device body is partially or completely detachably accommodated in the cavity, and a transmission unit is disposed between the remote controller and the main device body for transmitting electrical power.

5 Claims, 6 Drawing Sheets

WIRELESS SWITCHING CONTROLLER FOR MEDIA DEVICES

TECHNICAL FIELD

The present disclosure relates to a technical field of accessories for media devices, and in particular to a wireless switching controller for media devices.

BACKGROUND

There is one kind of wireless switching controllers provided for switching when people use mobile phones and digital products to read e-book, listen audio, or watch videos, such kind of wireless switching controllers each generally includes a main body and a matched remote controller, the main body is clamped on one mobile phone or one digital product, and the people may remotely control the one mobile phone or the one digital product to achieve operations, such as e-book page turning, audio switching, and video switching, through the matched remote controller, which is super convenient in use. In this way, such kind of wireless switching controllers are deeply favored by users.

Currently, in such kind of wireless switching controllers, the main body and the remote controller are two independent components, so that following disadvantages are caused. First, separation of the two independent components increases possibility of losing one of the two independent components, and another one is then useless; second, when the two independent components are not in use, the two independent components are easily forgot to different places, so that one of the two independent components may lose; third, the two components need to respectively charged to enable normal use, which easily causes that one of the two components is not electrically enabled to be used. Such disadvantages may affect user experience, there is a room for improvement.

SUMMARY

In order to solve problems in the prior art, the present disclosure provides a wireless switching controller for media devices, in which a main body is capable of assembling with a remote controller for facilitating storage and charging.

The present disclosure is achieved through following technical solutions.

The technical solutions provide the wireless switching controller for the media devices, including the main body and the remote controller. The remote controller includes a first housing having a cavity, the main body includes a main device body and a clamping component, and the clamping component is rotatably connected to the main device body through a rotating shaft. The remote controller is communicated with the main device body through a wireless communication manner. The main device body is partially or completely detachably accommodated in the cavity, and a transmission unit is disposed between the remote controller and the main device body for transmitting electrical power.

According to the wireless switching controller for the media devices, the cavity for accommodating the main body is formed on the remote controller, the wireless switching controller for the media devices further includes the transmission unit, when the wireless switching controller for the media devices is not in use, the main body is capable of accommodating in the cavity, as so to facilitate storage and convenient for being found. Moreover, the transmission unit is configured to transmit the electrical power between the remote controller and the main body, which is capable of charging one of the remote controller and the main body with low electrical power, so as to ensure that both the remote controller and the main body have enough electrical power. In this way, a situation that one of the remote controller and the main body has no electrical power is avoided, which is more convenient for use and further improves user experience.

Furthermore, the transmission unit is an electrical connector, and the electrical connector includes at least one conductive end and at least one conductive contact pin, the at least one conductive end is in contact with the at least one conductive contact pin, one of the at least one conductive end and the at least one conductive contact pin is disposed on the main device body, and another one of the at least one conductive end and the at least one conductive contact pin is disposed on the remote controller.

Furthermore, the transmission unit is a wireless charging module, the wireless charging module includes a first charging coil and a second charging coil, the first charging coil is disposed on the remote controller, and the second charging coil is disposed on the main device body.

Furthermore, the remote controller further includes a first circuit board and a first battery, the first circuit board and the first battery are disposed in the first housing, the first battery is electrically connected to the first circuit board, the first circuit board is electrically connected to the transmission unit. A first wireless communication module, at least one button, and a charging interface are disposed on the first circuit board, and at least one button cap is disposed on the first housing corresponding to the at least one button.

Furthermore, the main device body includes a second housing, a second circuit board, and a second battery, the second circuit board and the second battery are disposed in the second housing, the second battery is electrically connected to the second circuit board, and the second circuit board is electrically connected to the transmission unit. A second wireless communication module is disposed on the second circuit board, and the second wireless communication module is configured to wirelessly communicate with the first wireless communication module.

Furthermore, a third circuit board is disposed in the clamping component, at least one electrode post is welded on the third circuit board, and the third circuit board is electrically connected to the second circuit board.

Furthermore, a first limiting structure is disposed between the remote controller and the main device body, the first limiting structure is configured to limit the main device body in the cavity. The first limiting structure includes a first magnetic component and a second magnetic component, the first magnetic component is disposed in the remote controller, and the second magnetic component is disposed in the main device body, the first magnetic component and the second magnetic component are correspondingly disposed and magnetically attract each other.

Furthermore, the first limiting structure further includes a third magnetic component and a fourth magnetic component, the third magnetic component is disposed in the remote controller, and the fourth magnetic component is disposed in the main device body, the third magnetic component and the fourth magnetic component are correspondingly disposed and magnetically attract each other. A magnetic pole of the first magnetic component is disposed opposite to a magnetic pole of the third magnetic component.

Furthermore, a second limiting structure is disposed between the remote controller and the main device body, the second limiting structure is configured to limit the main device body in the cavity. The second limiting structure includes at least one limiting buckle and at least one buckling position, the at least one limiting buckle is disposed on a side wall of the cavity, and the at least one buckling position is defined on an outer side wall of the main device body, the at least one limiting buckle is inserted into the at least one buckling position for matching with the at least one buckling position.

Furthermore, a third limiting structure is disposed between the remote controller and the main device body, the third limiting structure is configured to limit the main device body in the cavity. The third limiting structure includes at least one limiting protrusion, the at least one limiting protrusion is disposed at a side edge of the cavity, and the at least one limiting protrusion is configured to press the main device body in the cavity.

It is to be understood that both the foregoing general description and the following detailed description are exemplary and explanatory only and do not the present disclosure.

BRIEF DESCRIPTION OF DRAWINGS

Through more detailed description of exemplary embodiments of the present disclosure with reference to accompanying drawings, above and other objects, features and advantages of the present disclosure shall become more apparent, specifically, in the exemplary embodiments of the present disclosure, the same reference numerals generally represent the same components.

Figure 1:
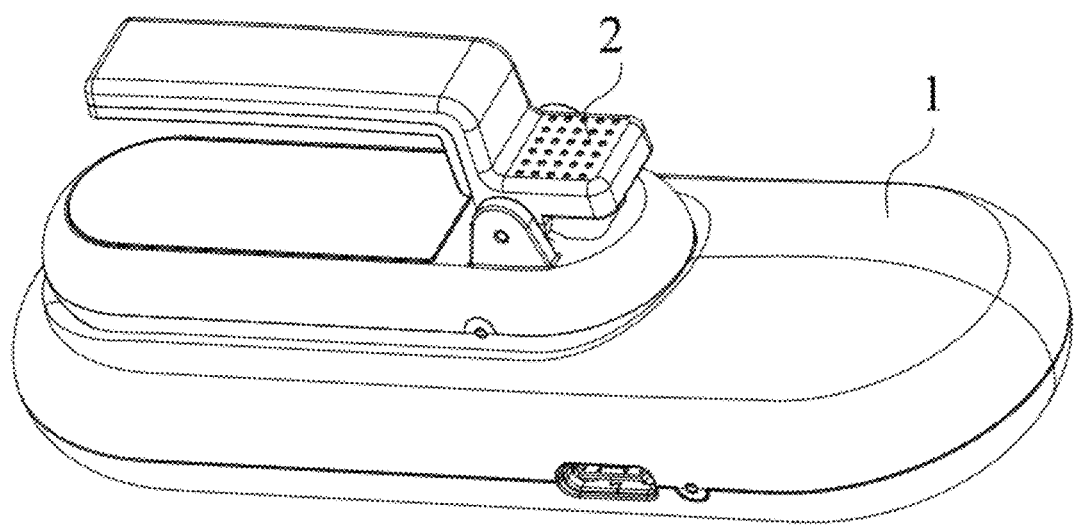
FIG. 1 is an overall structural schematic diagram of a wireless switching controller for media devices according to one embodiment of the present disclosure, where a main body is assembled with a remote controller.
Figure 2:
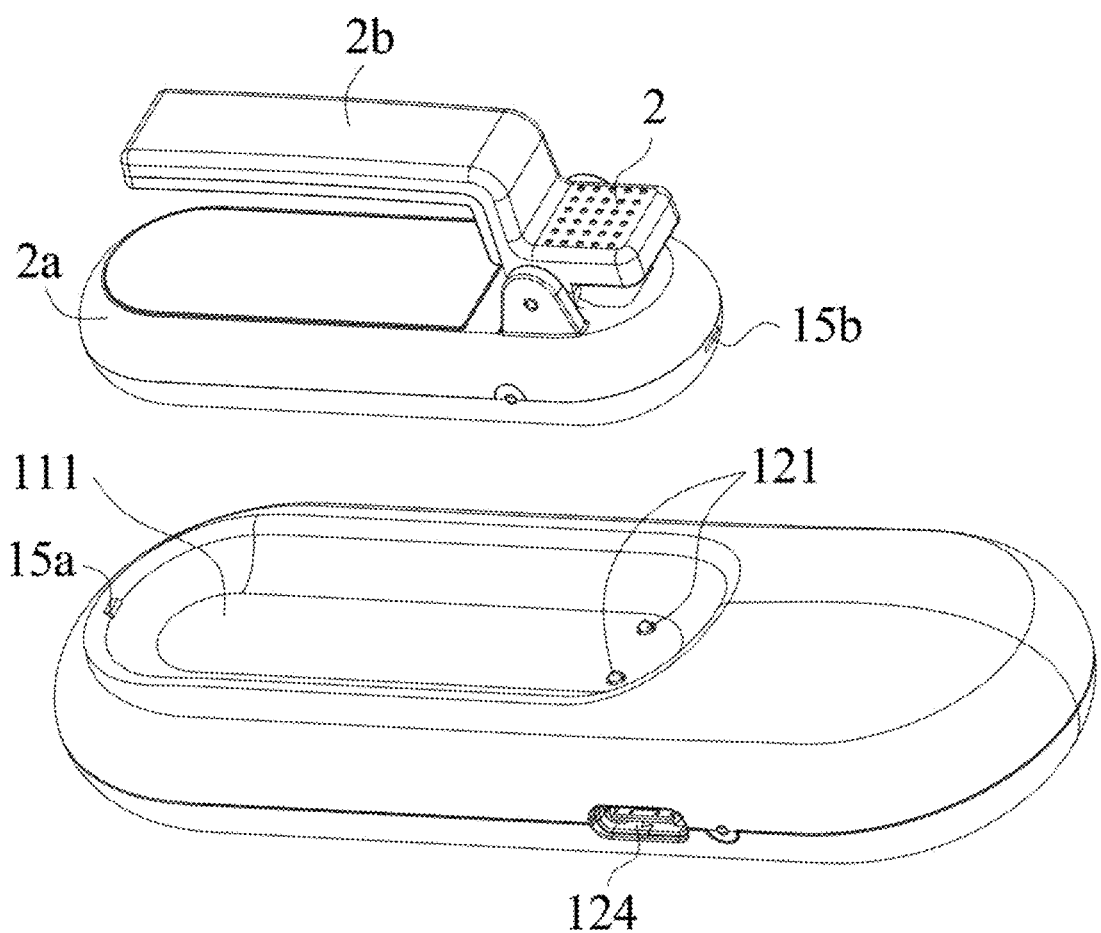
FIG. 2 is an overall structural schematic diagram of the wireless switching controller for the media devices according to one embodiment of the present disclosure, where the main body and the remote controller are separated.
Figure 3:
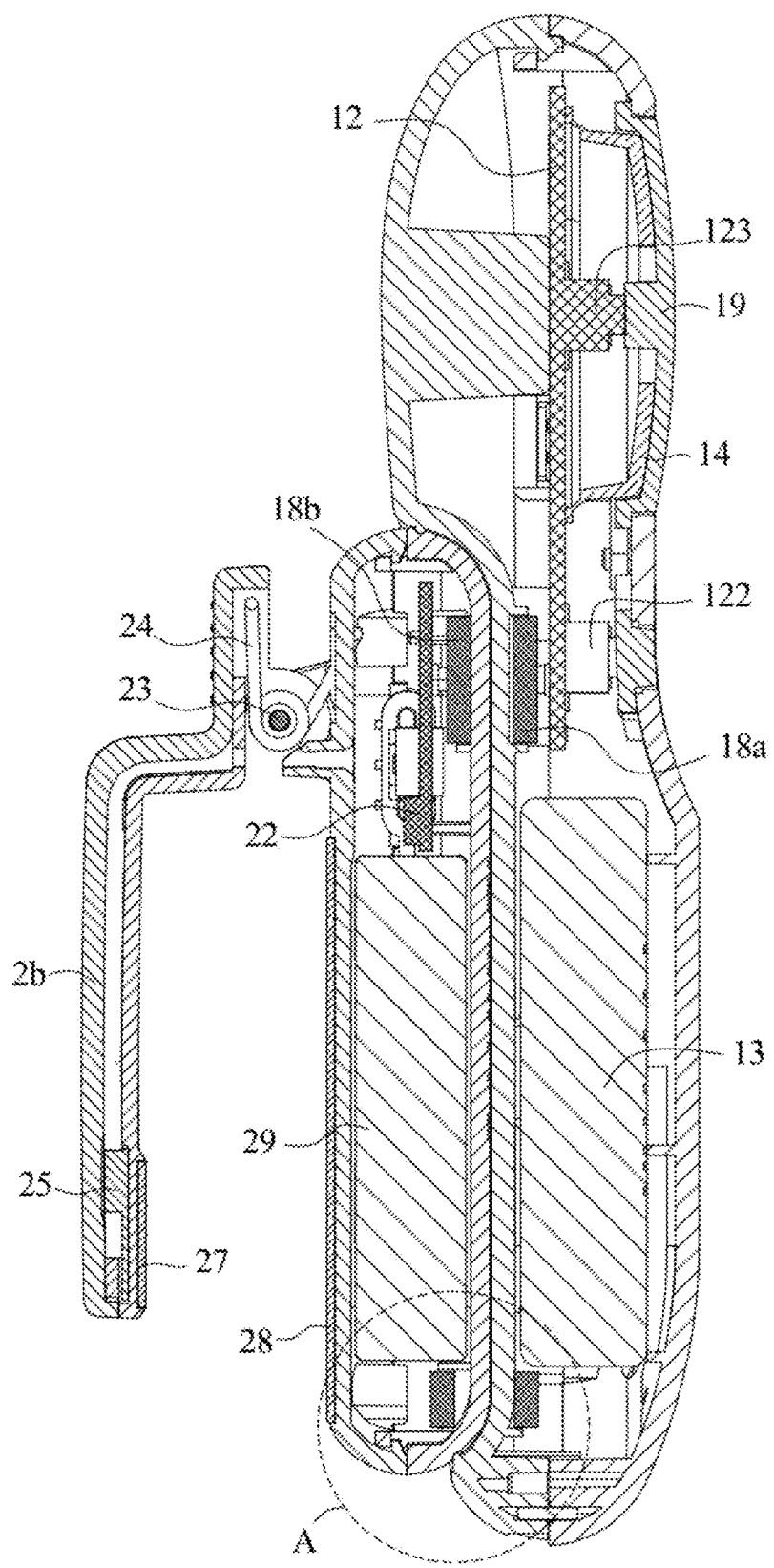
FIG. 3 is a cross-sectional structural schematic diagram of the wireless switching controller for the media devices according to one embodiment of the present disclosure, where the main body is assembled with the remote controller.
Figure 4:
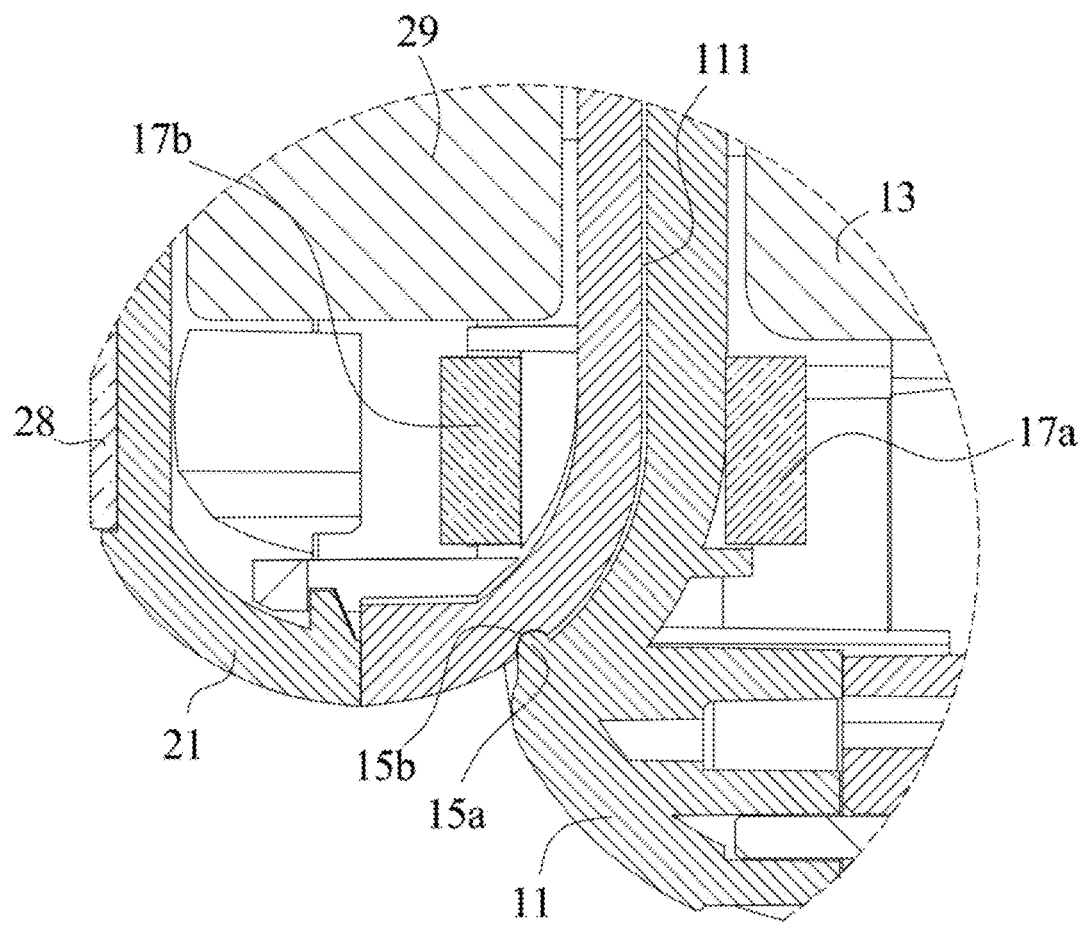
FIG. 4 is an enlarged schematic diagram of portion A shown in the cross-section structural schematic diagram of FIG. 3.

Reference numerals in the drawings: 1. controller; 11. first housing; 111. cavity; 12. first circuit board; 121. conductive contact pin; 122. first power button; 123. switching button; 124. charging interface; 13. first battery; 14. elastic body; 15a. limiting buckle; 15b. buckling position; 16. limiting protrusion; 17a. first magnetic component; 17b. second magnetic component; 18a. third magnetic component; 18b. fourth magnetic component; 19. button cap; 2. main body; 2a. main device body; 2b. clamping component; 21. second housing; 22. second circuit board 221. second power button; 222. conductive end; 23. rotating shaft; 24. torsion spring; 25. third circuit board; 26. electrode post; 27. first anti-slip gasket; 28. second anti-slip gasket; 29. second battery.

DETAILED DESCRIPTION OF EMBODIMENTS

In order to facilitate understanding of the present disclosure, the present disclosure is described more fully hereinafter with reference to accompanying drawings. Several embodiments of the present disclosure are shown in the accompanying drawings. However, the present disclosure may be implemented in many different forms and is not limited to the embodiments described herein. On the contrary, a purpose of providing these embodiments is to make the present disclosure more thorough and comprehensive.

Technical solutions of the embodiments of the present disclosure are described in detail below with reference to the accompanying drawings.

Please refer to FIGS. 1-7, the embodiments of the present disclosure provide a wireless switching controller for media devices, including a main body 2 and 1 remote controller 1. The remote controller 1 includes a first housing 11 having a cavity 111, the main body 2 includes a main device body 2a and a clamping component 2b, and the clamping component 2b is rotatably connected to the main device body 2a through a rotating shaft 23. The remote controller 1 is communicated with the main device body 2a through a wireless communication manner. The main device body 2a is partially or completely detachably accommodated in the cavity 111, and a transmission unit is disposed between the remote controller 1 and the main device body 2a for transmitting electrical power.

In this way, the cavity 111 for accommodating the main body 2 is formed on the remote controller 1, the wireless switching controller for the media devices further includes the transmission unit, when the wireless switching controller for the media devices is not in use, the main body 2 is capable of accommodating in the cavity 111, as so to facilitate storage and convenient for being found. Moreover, the transmission unit is configured to transmit the electrical power between the remote controller 1 and the main body 2, which is capable of charging one of the remote controller 1 and the main body 2 with low electrical power, so as to ensure that both the remote controller 1 and the main body 2 have enough electrical power, so that a situation that one of the remote controller 1 and the main body 2 has no electrical power is avoided, which is more convenient for use and further improves user experience.

In the embodiments, the transmission unit is an electrical connector, and the electrical connector includes at least one conductive end 222 and at least one conductive contact pin 121, the at least one conductive end 222 is in contact with the at least one conductive contact pin 221, one of the at least one conductive end 222 and the at least one conductive contact pin 121 is disposed on the main device body 2a, and another one of the at least one conductive end 222 and the at least one conductive contact pin 221 is disposed on the remote controller 1.

In one embodiment, the at least one conductive contact pin 121 is disposed on the remote controller 1 and is located on a bottom surface of the cavity 111, the at least one conductive end 222 is disposed on a surface of the main device body 2a, and when the main device body 2a is accommodated in the cavity 111, the at least one conductive end 222 is in contact with the at least one conductive contact pin 121 to achieve an electrical connection between the remote controller 1 and the main device body 2a, for example, after the main device body 2a or the remote controller 1 obtains electrical power of the two, one of the main device body 2a or the remote controller 1 with higher electrical power is controlled to charging another one of the main device body 2a or the remote controller 1 with lower electrical power.

In other embodiments, the transmission unit is a wireless charging module, the wireless charging module includes a first charging coil and a second charging coil, the first charging coil is disposed on the remote controller 1, and the second charging coil is disposed on the main device body 2a. Through using the wireless charging module to replace the electrical connector as foregoing, the same effect can be achieved.

In the embodiments, the remote controller 1 further includes a first circuit board 12 and a first battery 13, the first circuit board 12 and the first battery 13 are disposed in the first housing 11, the first battery 13 is electrically connected to the first circuit board 12, the first circuit board 12 is electrically connected to the at least one conductive contact pin 121 of the electrical connector. Specifically, the at least conductive contact pin 131 is directly disposed on the first circuit board 12, a first wireless communication module, at least one button, an indicator lamp, and a charging interface 124 are disposed on the first circuit board 12.

In one embodiment, the first wireless communication module is selected from a Bluetooth module, a 2.5G radio frequency (RF) wireless module, etc., the at least one button includes a first power button 122 and a switching button 123. Button caps are respectively disposed on the first housing 11 corresponding the first power button 122 and the switching button 123, specifically, an elastic body 14 made of silica gel or rubber is disposed on the switching button 123, the elastic body 14 is configured to reduce sound generated by the button caps 19 and the switching button 123 to achieve a silent effect, and the charging interface 124 is selected from a Type-C interface, a Mini-USB interface, etc.

In the embodiment, the main device body 2a includes a second housing 21, a second circuit board 22, and a second battery 29, the second circuit board 22 and the second battery 29 are disposed in the second housing 21, the second battery 29 is electrically connected to the second circuit board 22, and the second circuit board 22 is electrically connected to the at least one conductive end 222 of the electrical connector, specifically, the at least one conductive end 222 is a conductive post, the conductive post is disposed on the second circuit board 22. A second wireless communication module is further disposed on the second circuit board 22, and the second wireless communication module is configured to wirelessly communicate with the first wireless communication module. For example, the second wireless communication module is selected from the Bluetooth module, the 2.5G radio frequency (RF) wireless module, etc., a second power button 221 is disposed on the second circuit board 22, and the second power button 221 is configured to turn on or turn off the main device body 2a.

In the embodiments, the clamping component 2b is rotatably connected to the main device body 2a through the rotating shaft 23, a torsion spring 24 is further sleeved on the rotating shaft 23, the torsion spring 24 provides an elastic force for the clamping component 2b to rotate, a third circuit board 25 is disposed in the clamping component 2b, the third circuit board 25 is electrically connected to the second circuit board 22 through wires, at least one electrode post 26 is welded on the third circuit board 25, a first anti-flip gasket 27 is disposed on a surface of the clamping component 2b, and a second anti-flip gasket 27 is disposed on a surface of the main device body 2a.

When using the wireless switching controller for the media devices, the main device body 2a is first clamped on a mobile phone or a digital product to be operated, the first anti-slip gasket 27 on the clamping component 2b is in adaptive contact with a screen of the mobile phone or the digital product to be operated, the second power button 221 is pressed to turn on the main device body 2a to enter a wireless pairing mode, the main device body 2a is then wirelessly communicated with the remote controller 1, and the switching button 123 on the remote controller 1 is triggered to remotely control the mobile phone or the digital product to achieve operations, such as e-book page turning, audio switching, video switching, and volume adjustment. It should be noted that a touch screen control technology of such mobile phone or digital product belongs to the prior art, which is not described in detail herein.

In the embodiment, in order to prevent the main device body 2a from falling off when storing the main device body 2a, a first limiting structure is disposed between the remote controller 1 and the main device body 2a, the first limiting structure is configured to limit the main device body 2a in the cavity 111. The first limiting structure includes a first magnetic component 17a, a third magnetic component 18a, a second magnetic component 17b, and a fourth magnetic component 18b, the first magnetic component 17a and the third magnetic component 18a are disposed in the remote controller 1, the second magnetic component 17b and the fourth magnetic component 18b are disposed in the main device body 2a, the first magnetic component 17a and the second magnetic component 17b are correspondingly disposed and magnetically attract each other, the third magnetic component 18a and the fourth magnetic component 18b are correspondingly disposed and magnetically attract each other. The first magnetic component 17a, the third magnetic component 18a, the second magnetic component 17b, and the fourth magnetic component 18b limit the main device body 2a in the cavity 111 using magnetic attraction, in this way, taking down the clamping component 2b enables to take out the main device body 2a.

The first magnetic component 17a, the second magnetic component 17b, the third magnetic component 18a, and the fourth magnetic component 18b are magnets. In order to achieve an anti-mistake effect, a magnetic pole of the first magnetic component 17a is opposite to a magnetic pole of the third magnetic component 18a, in this way, the first magnetic component 17a repels the fourth magnetic component 18b, the third magnetic component 18a repels the second magnetic component 17b, and when the main device body 2a is inverted, the main device body 2a cannot be positioned due to magnetic repulsion.

In other embodiment, as a first alternative manner of the first limiting structure in the embodiments, a second limiting structure is disposed between the remote controller 1 and the main device body 2a, the second limiting structure is configured to limit the main device body 2a in the cavity 111. The second limiting structure includes at least one limiting buckle 15a and at least one buckling position 15b, the at least one limiting buckle 15a is disposed on a side wall of the cavity 111, and the at least one buckling position 15b is defined on an outer side wall of the main device body 2a, the at least one limiting buckle 15a is inserted into the at least one buckling position 15b for matching with the at least one buckling position 15b. Through cooperation between the at least one limiting buckle 15a and the at least one buckling position 15b, two limiting buckles 15a and two buckling positions 15b are respectively provided at two ends of the cavity 111 and two ends of the main device body 2a to limit the main device body 2a in the cavity 111. Such manner is manly applicable to a case that the main device body 2a is partially disposed in the cavity 111, and certainly is also applicable to a case that the main device body 2a is completely disposed in the cavity 111.

Figure 5:
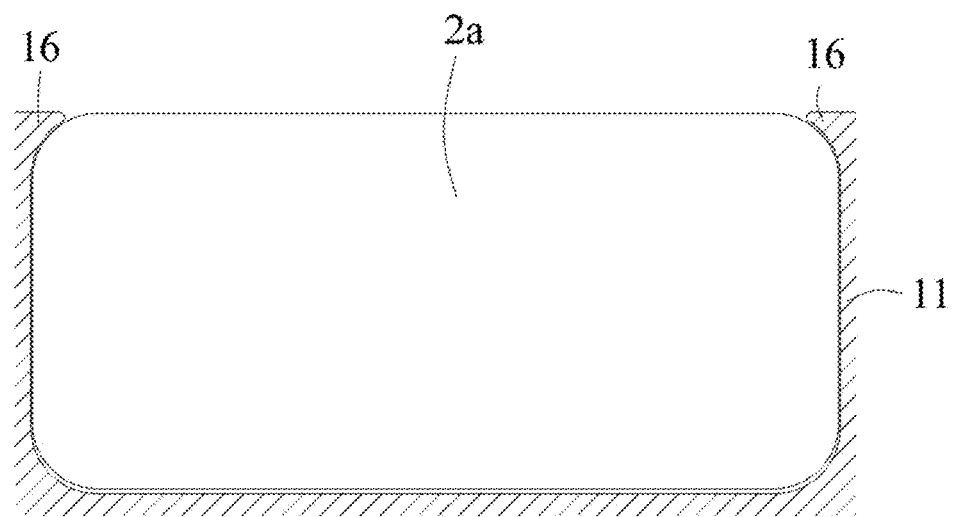
FIG. 5 is a structural schematic diagram of a third limiting structure according to one embodiment of the present disclosure.
Figure 6:
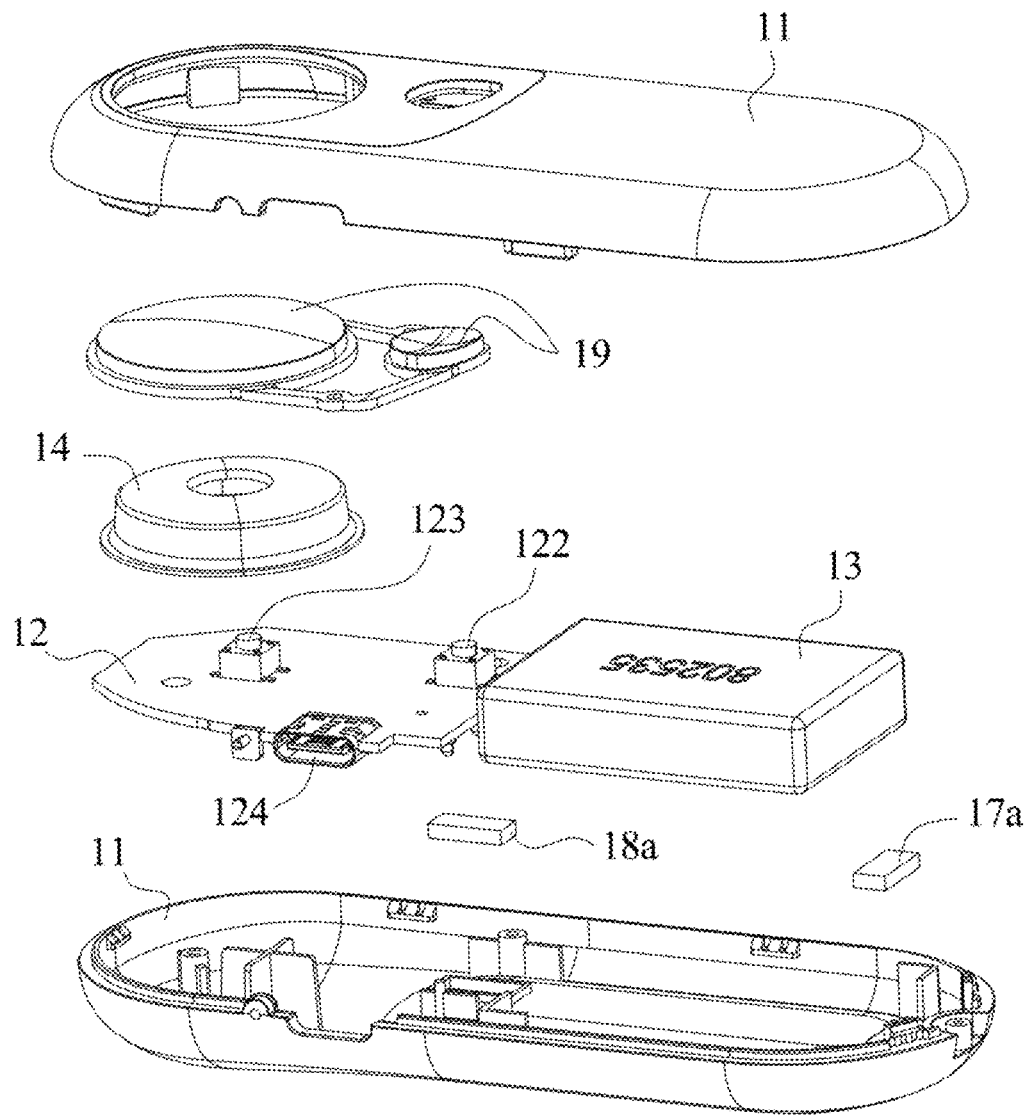
FIG. 6 is an exploded schematic diagram of the remote controller of the wireless switching controller for the media devices according to one embodiment of the present disclosure.
Figure 7:
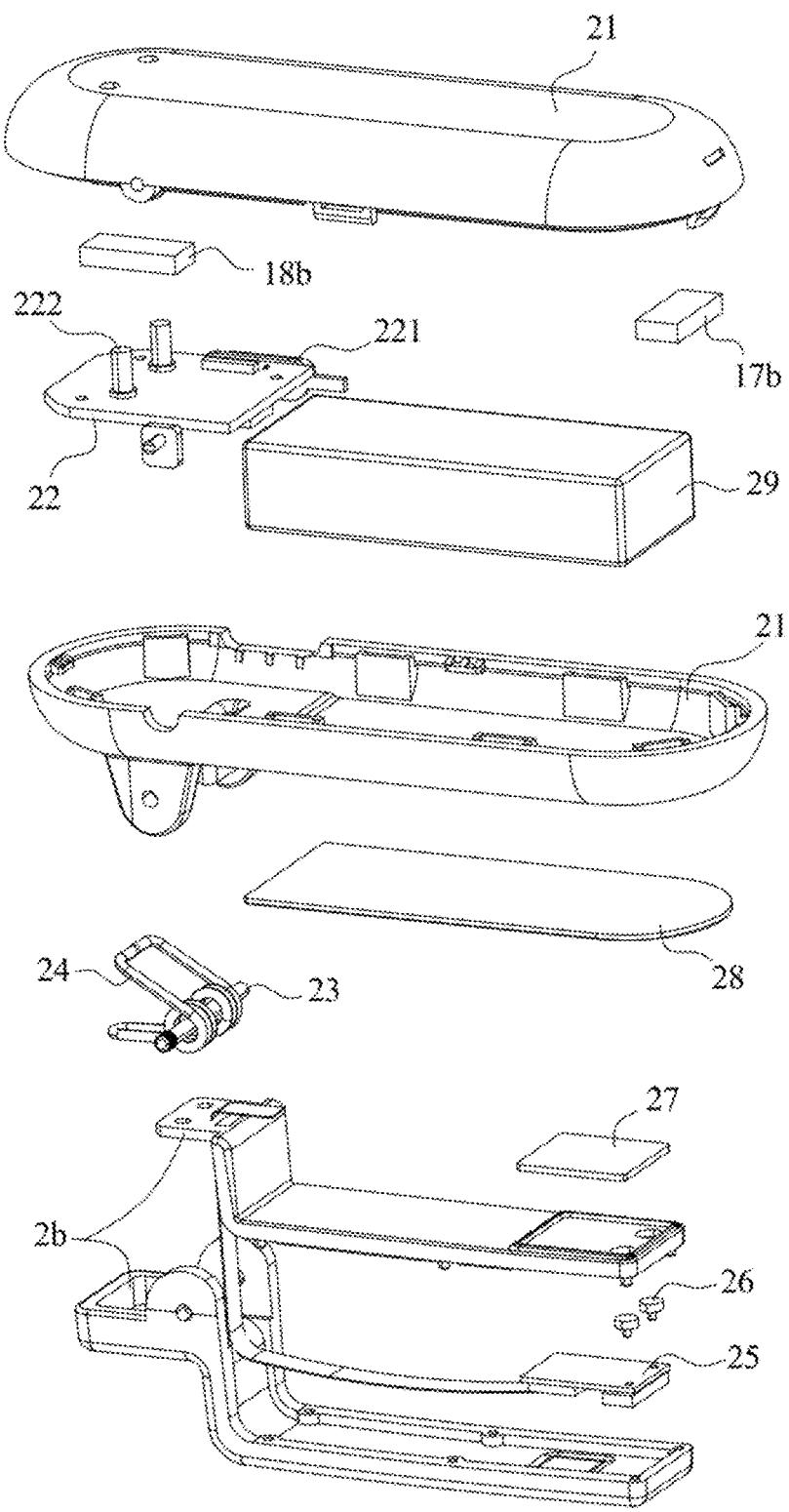
FIG. 7 is an exploded schematic diagram of the main body of the wireless switching controller for the media devices according to one embodiment of the present disclosure.

As shown in FIG. 5 in other embodiments, as a second alternative manner of the first limiting structure in the embodiments, a third limiting structure is disposed between the remote controller 1 and the main device body 2a, the third limiting structure is configured to limit the main device body 2a in the cavity 111. In the case that the main device body 2a is completely disposed in the cavity 111, the third limiting structure includes at least one limiting protrusion 16, the at least one limiting protrusion 16 is disposed at a side edge of the cavity 111, and the at least one limiting protrusion 16 is configured to press the main device body 2a in the cavity 111. In this way, the at least one limiting protrusion 16 applies a force on a side edge of the main device body 2a from an upper portion of the cavity 111 to limit the main device body 2a in the cavity 111.

In the embodiments, according to an actual application situation, a size of the remote controller 1 is larger than a size of the main body 2, which is convenient for holding the remote controller 1 by hands, and the main body 2 with a smaller size is light in weight, so that the main body 2 is capable of more stably clamping on the mobile phone or the digital product, and shielding on the screen is reduced as much as possible.

Descriptions of the various embodiments of the present disclosure have been presented for purposes of illustration, but are not intended to be exhaustive or limited to the embodiments disclosed. Many modifications and variations are apparent to those who skilled in the art without departing from a scope and spirit of the described embodiments. Terminology used herein is chosen to best explain principles of the embodiments, practical application, or improvement over technologies found in the marketplace, or to enable those who skilled in the art to understand the embodiments disclosed herein.

What is claimed is:

1. A wireless switching controller for media devices, comprising:
    a main body; and
    a remote controller;
    wherein the remote controller comprises a first housing having a cavity, the main body comprises a main device body and a clamping component, and the clamping component is rotatably connected to the main device body through a rotating shaft;
    the remote controller is communicated with the main device body through a wireless communication manner;
    the main device body is partially or completely detachably accommodated in the cavity, and a transmission unit is disposed between the remote controller and the main device body for transmitting electrical power;
    the transmission unit is an electrical connector, and the electrical connector comprises at least one conductive end and at least one conductive contact pin, the at least one conductive end is in contact with the at least one conductive contact pin, one of the at least one conductive end and the at least one conductive contact pin is disposed on the main device body, and another one of the at least one conductive end and the at least one conductive contact pin is disposed on the remote controller;
    the remote controller further comprises a first circuit board and a first battery, the first circuit board and the first battery are disposed in the first housing, the first battery is electrically connected to the first circuit board, the first circuit board is electrically connected to the transmission unit;
    a first wireless communication module, at least one button, and a charging interface are disposed on the first circuit board, and at least one button cap is disposed on the first housing corresponding to the at least one button;
    the main device body comprises a second housing, a second circuit board, and a second battery, the second circuit board and the second battery are disposed in the second housing, the second battery is electrically connected to the second circuit board, and the second circuit board is electrically connected to the transmission unit;
    a second wireless communication module is disposed on the second circuit board, and the second wireless communication module is configured to wirelessly communicate with the first wireless communication module; and
    a third circuit board is disposed in the clamping component, at least one electrode post is welded on the third circuit board, and the third circuit board is electrically connected to the second circuit board.

2. The wireless switching controller for the media devices according to claim 1, wherein a first limiting structure is disposed between the remote controller and the main device body, the first limiting structure is configured to limit the main device body in the cavity; and
    the first limiting structure comprises a first magnetic component and a second magnetic component, the first magnetic component is disposed in the remote controller, and the second magnetic component is disposed in the main device body, the first magnetic component and the second magnetic component are correspondingly disposed and magnetically attract each other.

3. The wireless switching controller for the media devices according to claim 2, wherein the first limiting structure further comprises a third magnetic component and a fourth magnetic component, the third magnetic component is disposed in the remote controller, and the fourth magnetic component is disposed in the main device body, the third magnetic component and the fourth magnetic component are correspondingly disposed and magnetically attract each other; and
    a magnetic pole of the first magnetic component is disposed opposite to a magnetic pole of the third magnetic component.

4. The wireless switching controller for the media devices according to claim 1, wherein a second limiting structure is disposed between the remote controller and the main device body, the second limiting structure is configured to limit the main device body in the cavity; and
    the second limiting structure comprises at least one limiting buckle and at least one buckling position, the at least one limiting buckle is disposed on a side wall of the cavity, and the at least one buckling position is defined on an outer side wall of the main device body, the at least one limiting buckle is inserted into the at least one buckling position for matching with the at least one buckling position.

5. The wireless switching controller for the media devices according to claim 1, wherein a third limiting structure is disposed between the remote controller and the main device body, the third limiting structure is configured to limit the main device body in the cavity; and the third limiting structure comprises at least one limiting protrusion, the at least one limiting protrusion is disposed at a side edge of the cavity, and the at least one limiting protrusion is configured to press the main device body in the cavity.

\* \* \* \* \*